| (12) | United States Patent | (10) Patent No.: | US 9,252,418 B2 |
|---|---|---|---|
| | Achhammer | (45) Date of Patent: | Feb. 2, 2016 |

(54) BATTERY FOR A VEHICLE AND METHOD OF OPERATING SUCH A BATTERY

(75) Inventor: Siegfried Achhammer, Regensburg (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 14/003,617

(22) PCT Filed: Feb. 15, 2012

(86) PCT No.: PCT/EP2012/000649
§ 371 (c)(1),
(2), (4) Date: Sep. 6, 2013

(87) PCT Pub. No.: WO2012/119692
PCT Pub. Date: Sep. 13, 2012

(65) Prior Publication Data
US 2013/0337294 A1  Dec. 19, 2013

(30) Foreign Application Priority Data
Mar. 9, 2011  (DE) .......................... 10 2011 013 394

(51) Int. Cl.
*G01N 27/416* (2006.01)
*H01M 2/34* (2006.01)
(Continued)

(52) U.S. Cl.
CPC ................ *H01M 2/34* (2013.01); *B60L 3/0046* (2013.01); *B60L 3/0069* (2013.01); *B60L 3/04* (2013.01); *B60L 11/1864* (2013.01); *B60L 11/1879* (2013.01); *H01M 10/44* (2013.01); *H01M 10/46* (2013.01); *H02J 7/0036* (2013.01); *B60L 2240/545* (2013.01); *B60L 2240/547* (2013.01); *B60L 2240/549* (2013.01);

*G01R 31/043* (2013.01); *H01M 10/448* (2013.01); *Y02T 10/7005* (2013.01); *Y02T 10/7011* (2013.01); *Y02T 10/7061* (2013.01)

(58) Field of Classification Search
USPC ......................................................... 324/433
See application file for complete search history.

(56) References Cited

U.S. PATENT DOCUMENTS

| 3,509,444 A | 4/1970 | Wright |
|---|---|---|
| 5,033,112 A | 7/1991 | Bowling et al. |

(Continued)

FOREIGN PATENT DOCUMENTS

| CN | 1199935 A | 11/1998 |
|---|---|---|
| DE | 26 51 067 | 5/1978 |

(Continued)

OTHER PUBLICATIONS

International Search Report issued by the European Patent Office in International Application PCT/EP2012/000649 on May 10, 2012.

(Continued)

*Primary Examiner* — Samuel Berhanu
(74) *Attorney, Agent, or Firm* — Henry M. Feiereisen LLC.

(57) ABSTRACT

A battery for a vehicle has a plurality of battery cells forming a cell stack. During the operation of the battery, electrical energy can be drawn from the cell stack or supplied to the cell stack via at least one cable. At least one monitoring device, in particular an optocoupler, is used to monitor a resistance that is present on at least one detachable junction of the at least one cable to an additional component of the battery, wherein the monitoring device is connected in a parallel branch to the junction. By monitoring the resistance at the junctions, local overheating of the battery can be prevented.

9 Claims, 1 Drawing Sheet

(51) Int. Cl.
*H01M 10/44* (2006.01)
*H01M 10/46* (2006.01)
*B60L 3/00* (2006.01)
*B60L 3/04* (2006.01)
*B60L 11/18* (2006.01)
*H02J 7/00* (2006.01)
*G01R 31/04* (2006.01)

(56) References Cited

U.S. PATENT DOCUMENTS

| | | | |
|---|---|---|---|
| 5,811,976 A * | 9/1998 | Fischer | 324/434 |
| 2007/0216226 A1* | 9/2007 | Matsumoto et al. | 307/10.1 |
| 2007/0259256 A1 | 11/2007 | Le Canut et al. | |
| 2008/0050645 A1 | 2/2008 | Kai et al. | |
| 2009/0212780 A1* | 8/2009 | Szuba et al. | 324/426 |
| 2011/0291641 A1* | 12/2011 | Nanayakkara | 324/126 |

FOREIGN PATENT DOCUMENTS

| | | |
|---|---|---|
| DE | 35 03 018 | 7/1986 |
| EP | 1 624 507 | 2/2006 |
| EP | 2 234 238 | 9/2010 |
| JP | 09-035753 | 2/1997 |

OTHER PUBLICATIONS

Chinese Search Report issued on Mar. 30, 2015 with respect to counterpart Chinese patent application 201280012194.6.

Translation of Chinese Search Report issued on Mar. 30, 2015 with respect to counterpart Chinese patent application 201280012194.6.

* cited by examiner

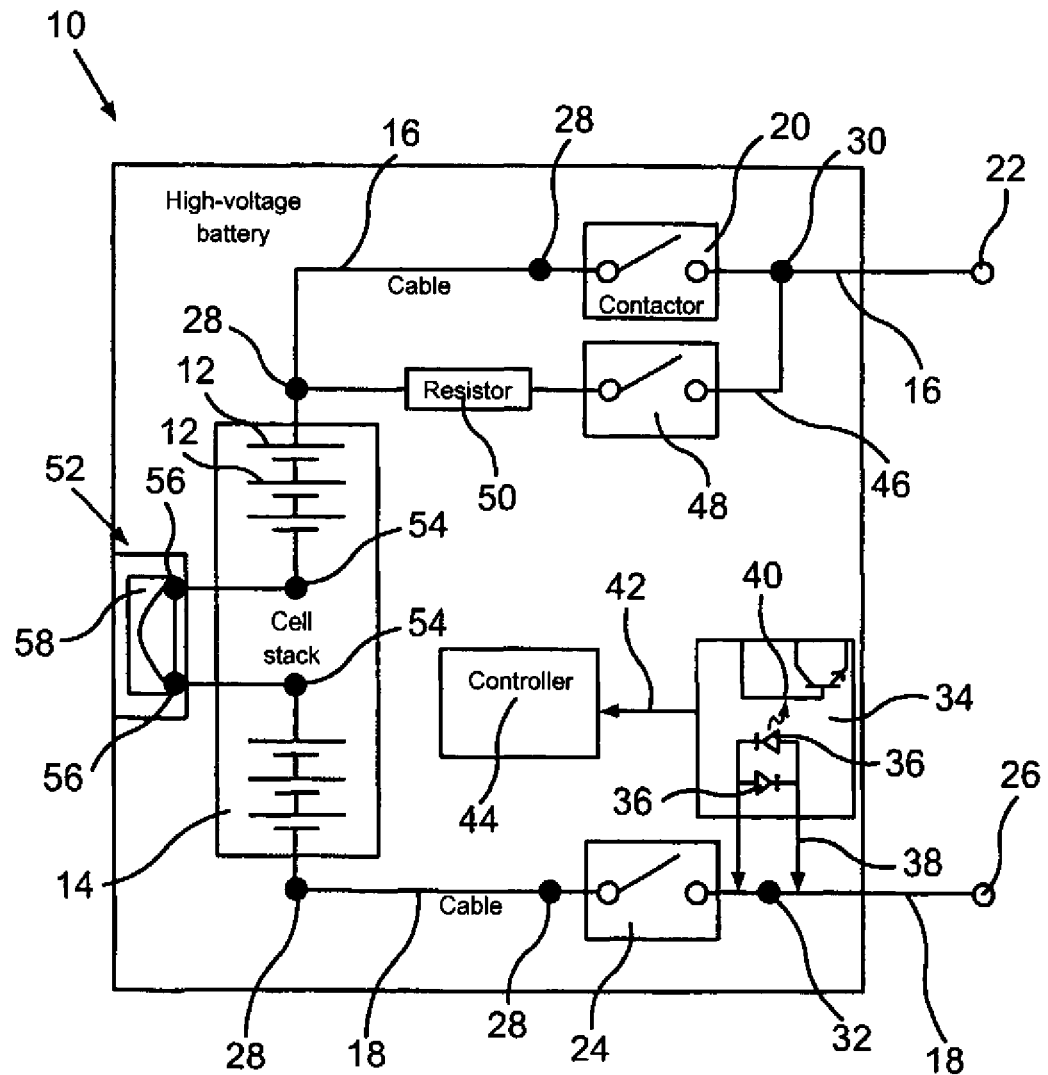

BATTERY FOR A VEHICLE AND METHOD OF OPERATING SUCH A BATTERY

CROSS-REFERENCES TO RELATED APPLICATIONS

This application is the U.S. National Stage of International Application No. PCT/EP2012/000649, filed Feb. 15, 2012, which designated the United States and has been published as International Publication No. WO 2012/119692 A1 and which claims the priority of German Patent Application, Serial No. 10 2011 013 394.1, filed Mar. 9, 2011, pursuant to 35 U.S.C. 119(a)-(d).

BACKGROUND OF THE INVENTION

The invention relates to a battery for a vehicle having a plurality of battery cells forming a cell stack. During the operation of the battery, electric power can be drawn from or supplied to the cell stack via at least one cable. The invention further relates to a method for operating such a battery.

Very high heating in high-voltage batteries for vehicles, especially in lithium-ion-based traction batteries, can cause serious malfunctions or can even endanger people. To prevent large local heat generation, detachable junctions of cables inside the battery are carefully constructed. Compliance with maintaining a predetermined tightening torque at screw-connected junctions is strictly adhered to. High quality of cable lugs and plug connections is observed for terminal connections or crimp connections so as to provide a detachable junction with a particularly low electrical resistance. This is to ensure that no local overheating occurs even under harsh operating conditions of the battery, which supplies a high electrical current and high electrical power, over the entire life cycle of the battery. Such overheating may occur for example with a loose junction.

JP 09035753 A describes a circuit arrangement for a battery, wherein a first voltmeter measures a current, which flows through a measuring resistor between two contact pins connected the two battery terminals. A second voltmeter measures the voltage across two additional contact pins which are also coupled with the two battery terminals. The contact resistance of the contact pins can be determined therefrom. Such circuit arrangement voltage for measuring the contact resistance with two voltmeters is very cumbersome.

It is therefore an object of the present invention to provide a battery and a method of the aforementioned type which enables a particularly safe operation of the battery in a simple manner.

SUMMARY OF THE INVENTION

This object is attained with a battery having a plurality of battery cells forming a cell stack, at least one cable connected to the cell stack, wherein electric energy can be drawn from the cell stack or supplied to the cell stack via the at least one cable during operation of the battery, and at least one monitoring device for monitoring a resistance present on at least one detachable junction of the at least one cable with an additional component of the battery, wherein the monitoring device is connected in a parallel branch in parallel with the at least one junction, and with a method for operating a battery for a vehicle, wherein the battery includes a plurality of battery cells forming a cell stack, with the method including drawing electrical energy from the cell stack or is supplying electrical energy to the cell stack via at least one cable, and monitoring a resistance present on at least one detachable junction of the at least one cable with a monitoring device connected in a parallel branch that is connected in parallel with the at least one junction.

In the battery according to the invention, at least a monitoring device is provided for monitoring a resistance present on at least one detachable junction of the at least one cable with another component of the battery, wherein the at least a monitoring device is connected in parallel with the at least one junction. It can then be determined with the monitoring device whether an impermissibly high contact resistance occurs at the junction with the cable, which may subsequently cause undesired overheating of the junction.

The devices usually provided in a traction battery, in particular a lithium ion battery, for detecting the temperature and electrical parameters are, due to their inadequate measuring precision, not suitable for detecting the contact resistance present at detachable junctions of the cable. For example, with a total voltage of the cell stack of 300 volts, a measurement uncertainty of 2.5% results in an error of up to 7.5 volts. This voltage can cause severe heating at the detachable junction of the cable, without being detectable by a measuring device which detects the voltage of the cell stack.

By providing at the detachable junction a monitoring device capable of detecting an increase in the contact resistance at the junction above a permitted maximum value, remedial actions can be timely initiated when the resistance exceeds a permitted maximum value.

This can ensure a particularly safe operation of the battery throughout its service life in a simple manner.

When the monitoring device is constructed as an analog voltmeter, providing an analog-to-digital converter and a potential separation between the high-voltage battery and a controller operated at lower voltage result in a relatively high complexity and correspondingly high costs.

According to a particularly advantageous embodiment of the invention, the at least one monitoring device therefore includes an optocoupler having an optical transmitter connected in parallel with the junction. As long as the contact resistance at the detachable junction of the cable is low, no current flows through the parallel branch of the optocoupler when current flows through the junction, and the optical transmitter does not emit light. However, when the contact resistance at the detachable junction assumes an impermissible high value, a sufficiently high voltage drop occurs in the parallel branch of the optocoupler with the optical transmitter when an electrical current flows across the junction, causing the optical transmitter to emit light. This light is then detected by a photo sensor of the optocoupler and used to generate a signal which is detected. By using the optocoupler, a potential separation between the cable of the high-voltage battery and evaluation device detecting the signal is attained in a simple and inexpensive way.

In an advantageous embodiment of the invention, a bidirectional optocoupler may be provided so that the occurrence of an impermissibly high contact resistance at the detachable junction of the cable can be detected when the battery is charging as well as when the battery is discharging.

According to another embodiment, to set a voltage value above which the optical transmitter emits light, at least one resistance element may be connected upstream of the optical transmitter of the optocoupler. In particular, the resistance element may be connected so that a triggering threshold of the optical transmitter can be varied.

A plurality of serially-connected junctions may be monitored by using only a single monitoring device. According to another advantageous embodiment of the invention, the monitoring device may be connected to the cable in the parallel branch so that the monitoring device can monitor the resistance of at least two serially-connected junctions. A cable area having multiple junctions can then be controlled with little effort when at least one the junctions has an impermissibly high contact resistance.

As a further advantage, the at least one monitoring device may be coupled to a controller configured to reduce the supply of electrical energy from the cell stack. This allows an automatic reduction of the electrical energy drawn from the cell stack as soon as a high contact resistance is detected on at least one detachable junction of the cable. In particular, the electrical energy drawn from the cell stack may be reduced to a value of zero, i.e. the battery system may be disconnected, when the monitoring device detects an excessively high resistance value at the releasable connection of the cable. Alternatively, the electrical energy drawn from the cell stack may be reduced to a value which is barely sufficient to propel the vehicle, allowing driving the vehicle in an emergency mode (limp home mode) home or to a service station or to a repair shop.

In another advantageous embodiment of the invention, the additional component of the battery may be a cable branch which is connected to a connector coupled to a battery terminal of the cell stack. Providing a plug or screw connection is common at such location, so that is would make sense for the safe operation of the battery to monitor a possible increase of the contact resistance at this location.

It is furthermore advantageous when the additional component is at least one contactor of the battery, wherein the monitoring device is connected in a parallel branch to a terminal of the contactor on the side of the cell stack. In this way, the safe connection from the cell stack to the contactor can be monitored. Additionally or alternatively, the monitoring device may be connected in a parallel branch to a terminal of the contactor on the output side which is coupled to a high-voltage terminal of the battery. The connection of the contactor can hereby also be monitored for a possible increase in the contact resistance state.

Moreover, only one monitoring device may be arranged in a parallel branch in parallel with a load current path of the contactor that includes both terminals of the contactor. In this way, the contact resistances of both terminals of the contactor as well as internal contacts of the contactor can be monitored. An increase in the resistance of the closed contactor to undesirably high levels can thus be detected.

The additional component of the battery may also include a safety plug, which may be used to interrupt an electrical connection within the cell stack. Such a safety plug, which is also referred to as service plug, can be pulled out to ensure during maintenance that the circuit within the cell stack is interrupted. Such safety plug may also include plug connections or screw connections, and high contact resistance at these detachable junctions may also cause undesired overheating. Monitoring the contact resistance with a monitoring device connected in a parallel branch to the junctions is therefore advantageous.

Lastly, the additional component of the battery may advantageously include a fuse coupled with the safety plug or integrated into the safety plug. Such optional safety device is typically coupled to the safety plug by a plug connection whose contact resistance can be monitored in this manner.

In the inventive method for operating a battery for a vehicle, a plurality of battery cells forms a cell stack, and electric energy is drawn from of the cell stack or supplied to the cell stack via at least one power cable. Here, a resistance across at least one detachable junction of the at least one cable is monitored with a monitoring device which is connected in a parallel branch of the at least one junction. The contact resistance at the at least one detachable junction of the cable can then be continuously controlled during operation of the battery, so that an increase in the contact resistance to impermissibly high values is timely detected when current flows through the junction of the cable. This makes the operation of the battery particularly safe.

The advantages and preferred embodiments described for the battery of the invention also apply to the method of the invention.

The features and combinations of features mentioned above in the description as well as the features and combinations of features mentioned below in the description of the drawing and/or shown alone in the FIGURE can be used not only in the respective described combination, but also in other combinations or in isolation, without departing from the scope of the invention.

BRIEF DESCRIPTION OF THE DRAWING

Further advantages, features and details of the invention will be apparent from the following description of preferred embodiments and the drawing which shows in:

FIG. 1 shows highly schematically a high-voltage battery for a vehicle, wherein the contact resistance at the screwed or plug-in connections of cables is constantly monitored while the high-voltage battery supplies or receives electric current.

DETAILED DESCRIPTION OF PREFERRED EMBODIMENTS

A high-voltage battery 10, which is used as a traction battery in a motor vehicle, includes a plurality of battery cells 12 forming a cell stack 14. Respective connecting cables 16 and 18 connect battery terminals of the cell stack 14 with a first main contactor 20 that is coupled to a positive high-voltage terminal 22 of the battery 10, and a second main contactor 24 that is coupled to a negative high-voltage terminal 26 of the battery 10.

The first connecting cable 16 is coupled to the respective junctions 28 to the battery terminal of the cell stack 14, on one hand, and to the main contactor 20, on the other hand, wherein the junctions 28 may be constructed as a screw or plug connections.

Similar junctions 28 provide the connection of the second connecting cable 18 to the other battery terminal of the cell stack 14 and to the second main contactor 24. Also, a junction 30, 32 of the respective main contactor 20, 24 on the associated high-voltage terminal 22, 26 is formed as a screw or plug connection of the respective connecting cable 16, 18.

Such junctions 28, 30, 32 may have high contact resistances, for example because they have become loose or due to wear. Such high contact resistance may lead to an undesirable overheating, which can cause a significant impairment of the battery 10 and at worst a fire. In the present case, it is therefore monitored, whether an impermissibly high resistance is present at the detachable junctions 28, 30, 32.

For this purpose, a respective optocoupler with light-emitting diodes 36 arranged in a parallel branch 38 of the respective junction 28, 30, 32, 34 is provided as a monitoring device. In the present example, only an exemplary connection of such an optocoupler 34 at the junction 32 is shown; however, the contact resistance is preferably monitored at all junctions 28, 30, 32.

The parallel branch 38 may also be connected to the connecting cable 18 in parallel with the serially-connected junctions 28, 32. A single optocoupler 34 is then sufficient to monitor both terminals of the main contactor 24 and the contacts inside the main contactor 24. In addition, the junction 28 of the cable 18 to a connection piece coupled to the battery terminal of the cell stack 14 can be monitored by using the same optocoupler 34.

In particular, when a single optocoupler 34 is used to monitor a plurality of junctions 28, 32 connected in series, at least one resistive element may be connected upstream of the light emitting diodes 36 for adjusting the trigger threshold of the light emitting diodes 36. For example, the respective light-emitting diode 36 of the optocoupler 34 may emit light only when a higher voltage drop occurs across this light emitting diode, when the parallel branch 38 is connected to the connecting cable 18 in parallel with a plurality of junctions 28, 32, than would otherwise be the case, when the optocoupler 34 monitors only a single junction 32.

In the present embodiment, the optocoupler 34 is formed as a bidirectional optocoupler 34, so that the resistance present at the junction 32 can be detected both during the charging and discharging of the cell stack 14. When the junction 32 has a low contact resistance, no current flows through the respective light-emitting diode 36. However, when the contact resistance at the junction 32 rises to an impermissibly high value, a voltage drops across the (unillustrated) resistive element that is connected upstream of the respective light-emitting diode 36, wherein the voltage drop is high enough to cause the light-emitting diode 36 to light up. A photosensor 40 of the optocoupler 34 detects the light emitted from the light emitting diode 36, and outputs through a signal cable 42 a corresponding signal to a controller 44. The controller 44 then ensures that the cell stack 14 supplies less electrical energy or no electrical energy at all. The optocoupler 34 may be integrated into the controller 44.

A precharging contactor 48 is arranged in a secondary cable 46 in parallel with the main contactor 20, wherein a pre-charging resistor 50 is connected upstream of the pre-charging contactor 48. The secondary cable 46 is coupled at the junction 28 to the connecting cable 16, and is connected at the junction 30 to the part of the connecting cable 16 that couples the main contactor 20 to the high-voltage terminal 22.

The cell stack 14, as shown here by way of example, may include a safety plug 52 that can be pulled out for maintenance, thereby interrupting an electrical connection within the cell stack 14. Plug contacts 54 of the safety plug 52 also represent detachable junctions, which can be monitored with an optocoupler 34 to detect an impermissibly high contact resistance. Here, too, an excessively high resistance on the plug contact 54 causes the optocouplers 34 that monitor the respective plug contact 34 to output a signal to the controller 44. Likewise, detachable junctions 56 that couple an (optional) fuse 58 with the safety plug 52 can be monitored.

Excessively high contact resistances at all junctions 56 and plug contacts 54 in the region of the safety plug 52 can be detected by using a single optocoupler 34 arranged in a parallel branch to both plug contacts 54.

A particularly safe operation of the high-voltage battery 10 can be ensured throughout its life cycle by continuously monitoring the relevant contact resistances on the detachable junctions 28, 30, 32, 54, 56 during operation of the high-voltage battery 10.

Moreover, when a fault occurs in the form of an impermissibly high resistance on at least one of the junctions 28, 30, 32, 54, 56, the supply of the electric power from the cell stack 14 may be reduced or interrupted in order to safely prevent undesired overheating of the battery system.

The invention claimed is:

1. A battery for a vehicle, comprising:
a plurality of battery cells forming a cell stack,
at least one cable connected to the cell stack, wherein electric energy can be drawn from the cell stack or supplied to the cell stack via the at least one cable during operation of the battery,
at least one monitoring device constructed as an optocoupler having an optical transmitter connected in parallel with the at least one junction for monitoring a resistance present on at least one detachable junction, at which the at least one cable is coupled with an additional component of the battery, wherein the monitoring device is connected in a parallel branch in parallel with the at least one junction, and
at least one resistance element connected upstream of the optical transmitter for setting a voltage value, wherein the optical transmitter emits light when the voltage value is exceeded, causing a controller to reduce or interrupt supplying electrical energy from or to the battery.

2. The battery of claim 1, wherein the optocoupler is a bidirectional optocoupler.

3. The battery of claim 1, wherein the at least one monitoring device is configured to monitor at least two serially-connected junctions.

4. The battery of claim 1, wherein the at least one monitoring device is coupled with a controller configured to reduce electrical energy supplied from the cell stack.

5. The battery of claim 4, wherein the electrical energy supplied from the cell stack is reduced to a value of zero.

6. The battery of claim 1, wherein the additional component is at least one contactor of the battery, and wherein the at least one monitoring device is connected in the parallel branch to
a terminal of the contactor on a side of cell stack or
a terminal of the contactor that is coupled to a high voltage terminal of the battery or
a load current path of the contactor encompassing two terminals of the contactor.

7. The battery of claim 1, wherein the additional component comprises a safety plug configured to interrupt an electrical connection within the cell stack.

8. The battery of claim 7, wherein the additional component comprises a fuse coupled with the safety plug.

9. A method for operating a battery for a vehicle, wherein the battery includes a plurality of battery cells forming a cell stack, comprising:
drawing electrical energy from the cell stack or supplying electrical energy to the cell stack via at least one cable,
monitoring a resistance present on at least one detachable junction with an optocoupler having an optical transmitter connected in parallel with the at least one detachable junction, at which the at least one cable is coupled with an additional component of the battery, with a monitoring device connected in a parallel branch that is connected in parallel with the at least one junction,
setting a voltage value with at least one resistance element connected upstream of the optical transmitter, wherein the optical transmitter emits light when the voltage value is exceeded, and
reducing or interrupting supplying electrical energy from or to the cell stack when the optical transmitter emits light.

* * * * *